United States Patent
Foote, Jr. et al.

(10) Patent No.: US 7,470,594 B1
(45) Date of Patent: Dec. 30, 2008

(54) SYSTEM AND METHOD FOR CONTROLLING THE FORMATION OF AN INTERFACIAL OXIDE LAYER IN A POLYSILICON EMITTER TRANSISTOR

(75) Inventors: Richard W. Foote, Jr., Kennedale, TX (US); William Max Coppock, Arlington, TX (US); Darren Lee Rust, Arlington, TX (US); Charles A. Dark, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 165 days.

(21) Appl. No.: 11/302,920

(22) Filed: Dec. 14, 2005

(51) Int. Cl.
*H01L 21/331* (2006.01)
*H01L 21/8222* (2006.01)

(52) U.S. Cl. ............... 438/309; 438/663; 438/202; 438/513; 438/905; 257/E21.227; 257/E21.284; 257/E21.412; 257/E21.497

(58) Field of Classification Search ........ 438/309, 438/197, 202, 313, 513, 474, 475, 663, 905, 438/657
See application file for complete search history.

(56) References Cited

U.S. PATENT DOCUMENTS

| | | | |
|---|---|---|---|
| 6,570,184 B2 * | 5/2003 | Horikoshi et al. | 257/72 |
| 6,703,283 B1 * | 3/2004 | Ballantine et al. | 438/309 |
| 6,815,717 B2 * | 11/2004 | Horikoshi et al. | 257/64 |
| 6,856,000 B2 | 2/2005 | Trogolo et al. | |
| 6,984,593 B2 * | 1/2006 | Ballantine et al. | 438/787 |
| 7,008,852 B2 * | 3/2006 | Ballantine et al. | 438/309 |
| 2002/0142500 A1 * | 10/2002 | Foglietti et al. | 438/22 |
| 2004/0185631 A1 | 9/2004 | Kriz et al. | |
| 2004/0212045 A1 | 10/2004 | Tilke et al. | |
| 2004/0227210 A1 | 11/2004 | Tilke et al. | |
| 2005/0054170 A1 | 3/2005 | Steinmann et al. | |
| 2005/0087812 A1 | 4/2005 | Trogolo et al. | |
| 2005/0106829 A1 | 5/2005 | Rudolph et al. | |
| 2006/0030099 A1 * | 2/2006 | Ballantine et al. | 438/202 |

OTHER PUBLICATIONS

A. T. Tilke et al., "As-Doped Polysilicon Emitters with Interfacial Oxides and Correlation to Bipolar Device Characteristics", J. Vac. Sci. Technol., B 23(5), Sep./Oct. 2005, pp. 1877-1882.
Abdelshafy A. Eltoukhy et al., "The Role of the Interfacial Layer in Polysilicon Emitter Bipolar Transistors", IEEE Transactions on Electron Devices, vol. ED-29, No. 12, Dec. 1982, pp. 1862-1869.

(Continued)

*Primary Examiner*—David Nhu

(57) ABSTRACT

A method is disclosed for controlling the formation of an interfacial oxide layer in a polysilicon emitter transistor device. The interfacial oxide layer is formed between an underlying substrate of single crystal silicon and an upper layer of polysilicon. The current gain and the emitter resistance of the transistor device are related to the thickness of the interfacial oxide layer. The oxide of the interfacial oxide layer is grown in a low pressure, low temperature pure oxygen ($O_2$) environment that greatly reduces the oxidation rate. The low oxidation rate allows the thickness of the interfacial oxide layer to be precisely controlled and sources of variation to be minimized in the manufacturing process.

20 Claims, 3 Drawing Sheets

OTHER PUBLICATIONS

Paul Van Halen et al., "High-Gain Bipolar Transistors with Polysilicon Tunnel Junction Emitter Contacts", IEEE Transactions on Electron Devices, vol. ED-32, No. 7, Jul. 1985, pp. 1307-1313.

Ian R. C. Post et al., "Polysilicon Emitters for Bipolar Transistors: A Review and Re-Evaluation of Theory and Experiment", IEEE Transactions on Electron Devices, vol. 39, No. 7, Jul. 1992, pp. 1717-1731.

G. R. Wolstenholme et al., "An Investigation of the Thermal Stability of the Interfacial Oxide in Polycrystalline Silicon Emitter Bipolar Transistors by Comparing Device Results with High-Resolution Electron Microscopy Observations", J. Appl. Phys. 61 (1), Jan. 1, 1987, pp. 225-233.

M. R. Madani et al., "Low Temperature Oxidation of Silicon", Electronics Letters, Jul. 7, 1988, vol. 24, No. 14, pp. 856-857.

B. Soerowirdjo et al., "The Influence of Surface Treatments on the Electrical Characteristics of Polysilicon Emitter Bipolar Transistors", 1982 IEEE, pp. 668-671.

Paul A. Potyraj et al., "Interfacial Oxide, Grain Size, and Hydrogen Passivation Effects on Polysilicon Emitter Transistors", IEEE Transactions on Electron Devices, vol. 35, No. 8, Aug. 1988, pp. 1334-1343.

Luis M. Castaner et al., "Effects of Rapid Thermal Processing on the Current Gain and Emitter Resistance of Polysilicon Emitter Bipolar Transistors", IEEE Electron Devices Letters, vol. 12, No. 1, Jan. 1991, pp. 10-12.

Peter Ashburn et al., "Comparison of Experimental and Theoretical Results on Polysilicon Emitter Bipolar Transistors", IEEE Transactions on Electron Devices, vol. ED-31, No. 7, Jul. 1984, pp. 853-860.

Peter Ashburn et al., "Comparison of Experimental and Computed Results on Arsenic-and Phosphorus-Doped Polysilicon Emitter Bipolar Transistors", IEEE Transactions on Electron Devices, vol. ED-34, No. 6, Jun. 1987, pp. 1346-1353.

J. S. Hamel et al., "Trade-Off Between Emitter Resistance and Current Gain in Polysilicon Emitter Bipolar Transistors with Intentionally Grown Interfacial Oxide Layers", IEEE Electron Device Letter, vol. 13, No. 6, Jun. 1992, pp. 332-334.

John Starr Hamel et al., "Two-Dimensional Analysis of Emitter Resistance in the Presence of Interfacial Oxide Breakup in Polysilicon Emitter Bipolar Transistors", IEEE Transactions on Electron Devices, vol. 39, No. 9, Sep. 1992, pp. 2139-2146.

M. Jagadesh Kumar et al., "Collector Design Tradeoffs for Low Voltage Applications of Advanced Bipolar Transistors", IEEE Transactions on Electron Devices, vol. 40, No. 8, Aug. 1993, pp. 1478-1483.

Robert H. Reuss et al., "Application of a Cluster Tool for Interface Engineering of Polysilicon Emitters", IEEE 1993 Bipolar Circuits and Technology Meeting 3.4, pp. 49-52.

P. Austin et al., "Technology and Characterization of Polysilicon Emitter Bipolar Transistors for Power Applications", Solid-State Electronics vol. 38, No. 3, 1995, pp. 587-598.

Takashi Hashimoto et al., "Interface Controlled IDP Process Technology for 03µm High-Speed Bipolar and BiCMOS LSls", IEEE BCTM 11.3, pp. 181-184, date unknown.

D. Starodub et al., "Silicon Oxide Decomposition and Desorption During the Thermal Oxidation of Silicon", Surface Review and Letters, vol. 6, No. 1 (199), pp. 45-52, date unknown.

Ahmad Ismat Abdul Rahim et al., "Impact of Ex-Situ and In-Situ Cleans on the Performance of Bipolar Transistors With Low Thermal Budget In-Situ Phosphorus-Doped Polysilicon Emitter Contacts", IEEE Transactions on Electron Devices, vol. 48, No. 11, Nov. 2001, pp. 2506-2513, date unknown.

Li-Shyue Lai et al., "The High Quality Low Temperature Oxidation Technology in a Quasi Self-Aligned SiGe HBT", Proceedings EDMO 2001/Vienna, IEEE 2001, pp. 77-82.

Zhang Li Chun et al., "Improvement of RCA Transistor Using RTA Annealing After the Formation of Interfacial Oxide", IEEE Transactions on Electron Devices, vol. 49, No. 6, Jun. 2002, pp. 1075-1076.

Md Mazhar Ul Hoque et al., "Effect of Interfacial Oxide Thickness on 1/f Noise in Polysilicon Emitter BJT's", IEEE Transactions on Electron Devices, vol. 51, No. 9, Sep. 2004, pp. 1504-1513.

* cited by examiner

SYSTEM AND METHOD FOR CONTROLLING THE FORMATION OF AN INTERFACIAL OXIDE LAYER IN A POLYSILICON EMITTER TRANSISTOR

TECHNICAL FIELD OF THE INVENTION

The present invention is generally directed to manufacturing technology for semiconductor devices and, in particular, to a system and method for controlling the formation of an interfacial oxide layer in a polysilicon emitter transistor device.

BACKGROUND OF THE INVENTION

In the manufacture of transistors having a polysilicon emitter structure a thin interfacial oxide layer is formed between an underlying substrate of single crystal silicon ("monocrystalline silicon") and an upper layer of polycrystalline silicon ("polysilicon"). The presence of the interfacial oxide layer provides an increase in the current gain β of the transistor and generally improves the operation of the transistor. See, e.g., "The Role of the Interfacial Layer in Polysilicon Emitter Bipolar Transistors," by A. A. Eltoukhy and D. J. Roulston in IEEE Transactions on Electron Devices, Volume 29, pp. 1862-1869 (1982).

For purposes of illustration, consider a portion of an exemplary prior art semiconductor device 100 shown in FIG. 1. Semiconductor device 100 comprises a monocrystalline silicon layer 110, an interfacial oxide layer 120, and a polysilicon emitter layer 130. During the manufacturing process of semiconductor device 100 the interfacial oxide layer 120 is formed on the underlying monocrystalline structure 110. Then the polysilicon emitter layer 130 is formed on the interfacial oxide layer 120.

The formation of an interfacial oxide is one of the critical manufacturing parameters for controlling current gain and emitter resistance in polysilicon emitter devices. The interfacial oxide may be formed from (1) native oxidation (oxide is grown in air at room temperature), (2) chemical oxidation (oxide is grown during a pre-clean process), (3) parasitic thermal oxidation (oxide is grown during initial heating of the wafers in the polysilicon deposition furnace), and (4) deliberate thermal oxidation (oxide is grown in the controlled environment of the polysilicon deposition furnace prior to the polysilicon deposition step). All four of the sources of oxidation mentioned above can contribute to the formation of the interfacial oxide layer. Great care must be taken to control each of the sources of oxidation in order to ensure the creation of an interfacial oxide layer that may be consistently repeated.

Several types of prior art methods have been employed to create an interfacial oxide layer. One of the earliest methods involved controlling (1) the rate at which wafers were pushed into a polysilicon furnace, (2) the temperature in the polysilicon furnace, and (3) the rate of inert purge gas flow in the polysilicon furnace. In this method the wafers at the pump end of the furnace load are heated longer than the wafers at the door end of the furnace. This creates an inherent difference in the interfacial oxide thickness in wafers at the two ends of the furnace.

In addition, changes in the relative humidity of the room can also make a very large difference in the oxidation rate. Some prior art attempts have been made to alleviate the contributions from the ambient atmosphere. Prior art devices have been attached to the mouth of the furnace tube to prevent the ambient atmosphere from reaching the wafers and from backstreaming into the furnace tube as the wafers are loaded. These devices are expensive, difficult to use, and have been known to create problems.

Another prior art method pre-oxidizes the wafer using a rapid thermal processing (RTP) step prior to the step of polysilicon deposition. The pre-oxidation step can be done either as a "stand alone" process or along with the deposition in the same RTP system. The rapid thermal processing allows for a very short oxidation time. Rapid thermal processing, however, only processes one wafer at a time. Therefore, in-situ deposition of the polysilicon (which can not be done very quickly) is impractical for single wafer processing. Adding a separate rapid thermal processing (RTP) step is undesirable because it adds handling, cycle time, capital equipment requirements, and more opportunities for creating scrap.

The amount of time between the rapid thermal processing (RTP) oxidation and the deposition of the polysilicon is critical because the interfacial oxide is grown very thin. If the oxide is given a chance to absorb moisture from the ambient atmosphere, further oxidation could occur as the wafers are pushed into the hot polysilicon deposition system. In addition, temperature control (and therefore control of the oxidation rate and the final interfacial oxide layer thickness) is much more difficult in a rapid thermal processing (RTP) step than in a furnace. This is because a furnace is a black body system.

Another prior art method for reducing the oxidation rate involves using dilute oxygen ($O_2$). Unfortunately, maintaining a proper value of the oxygen partial pressure is very difficult. This is because any change in the oxygen or diluent will result in a change in the value of the oxygen partial pressure. For example, assume a gas flow of 0.3 LPM oxygen in a 9.7 LPM nitrogen. This arrangement represents a three percent (3%) oxygen ($O_2$) atmosphere. If either or both of the gas flows change such that the ratio goes to a four percent (4%) oxygen atmosphere, this causes only a one percent (1%) absolute change but a twenty five percent (25%) change from the first value of oxygen to the second value of oxygen.

Another prior art method has involved the formation of a chemically grown oxide layer after the removal of the existing oxide but before the deposition of the polysilicon. This is usually done with a combination of ammonium hydroxide, hydrogen peroxide and water. This combination is sometimes referred to as an "RCA1" clean or "APM". With this method the oxide thickness is sensitive not only to the initial chemical ratios, and the temperature of the solution, and the time in the solution, but also to the history of the bath. The active ingredients of the solution change over time and with use. Therefore, the active ingredients can be strongly affected by the contamination level on wafers that were run before the wafers that are targeted for critical oxide control.

Hydrogen termination in the pre-clean step can help reduce the formation of native oxide, and so reduce the sensitivity of the final oxide thickness to the time between the pre-clean and the polysilicon deposition. This is true for any of the prior art methods described above.

In view of the deficiencies of the prior art methods, there is a need for an efficient system and method that is capable of controlling the formation of an interfacial oxide in a polysilicon emitter transistor device. There is also a need in the art for an efficient system and method that is capable of precisely controlling the thickness of an interfacial oxide in a polysilicon emitter transistor device.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
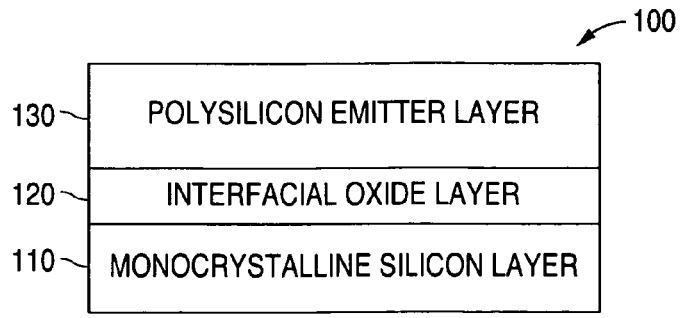
FIG. 1 illustrates a prior art semiconductor device comprising a monocrystalline silicon layer, an interfacial oxide layer, and a polysilicon emitter layer.

FIGS. 2 through 5, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

The method of the present invention minimizes variations that occur in the formation of the interfacial oxide layer by growing most of the interfacial oxide layer using deliberate thermal oxidation in a specially controlled environment. The specially controlled environment is a low pressure, low temperature environment. In one advantageous embodiment of the method of the invention, the environment comprises a pure oxygen ($O_2$) environment. The use of a specially controlled environment to grow the interfacial oxide layer greatly reduces the oxidation rate and minimizes the sources of variation.

In one advantageous embodiment of the method of the invention, the thermal oxidation process that creates the interfacial oxide layer is conducted in a pure oxygen ($O_2$) environment. Using oxygen diluted with nitrogen or argon requires that the mass flow controllers be precisely matched.

The pure oxygen ($O_2$) environment is maintained at a low pressure of approximately five hundred milliTorr (500 mTorr) or, equivalently, approximately one half Torr (0.5 Torr). The low pressure value may be in the range of approximately fifty milliTorr (50 mTorr) to one thousand milliTorr (1000 mTorr). The low pressure value of the present invention may be controlled by adjusting the value of the low pressure by plus or minus five milliTorr (+/−5 mTorr). A change of more than plus or minus fifty milliTorr (+/−50 mTorr) is required to change the current gain and emitter resistance.

In one advantageous embodiment of the method of the invention, the temperature of the low pressure pure oxygen ($O_2$) environment is approximately six hundred ten degrees Celsius (610° C.). The range of low temperature may be from approximately four hundred fifty degrees Celsius (450° C.) to seven hundred degrees Celsius (700° C.). The low temperature value of the present invention may be controlled by adjusting the value of the low temperature by plus or minus three degrees Celsius (+/−3° C.). A change of more than plus or minus twelve degrees Celsius (+/−12° C.) is required to change the current gain and emitter resistance.

The thermal oxidation process that creates the interfacial oxide layer of the present invention is controlled by adjusting the time of the application of the thermal oxidation process. In one advantageous embodiment of the method of the invention, the application of the thermal oxide process is controlled by adjusting the time of application of the thermal oxide process to multiples of a five (5) minute interval. That is, the time of application of the thermal oxide process may be five (5) minutes, ten (10) minutes, fifteen (15) minutes, etc.

Before the thermal oxide process is initiated to create the interfacial oxide layer 120, a pre-clean process is usually applied to the underlying monocrystalline silicon layer 110. A pre-clean process that employs hydrogen fluoride (HF) does not create any oxide layer on the underlying monocrystalline silicon layer 110. On the other hand, a RCA1 type of pre-clean process creates some oxide layer on the underlying monocrystalline silicon layer 110 by a chemical oxidation process.

Figure 2:
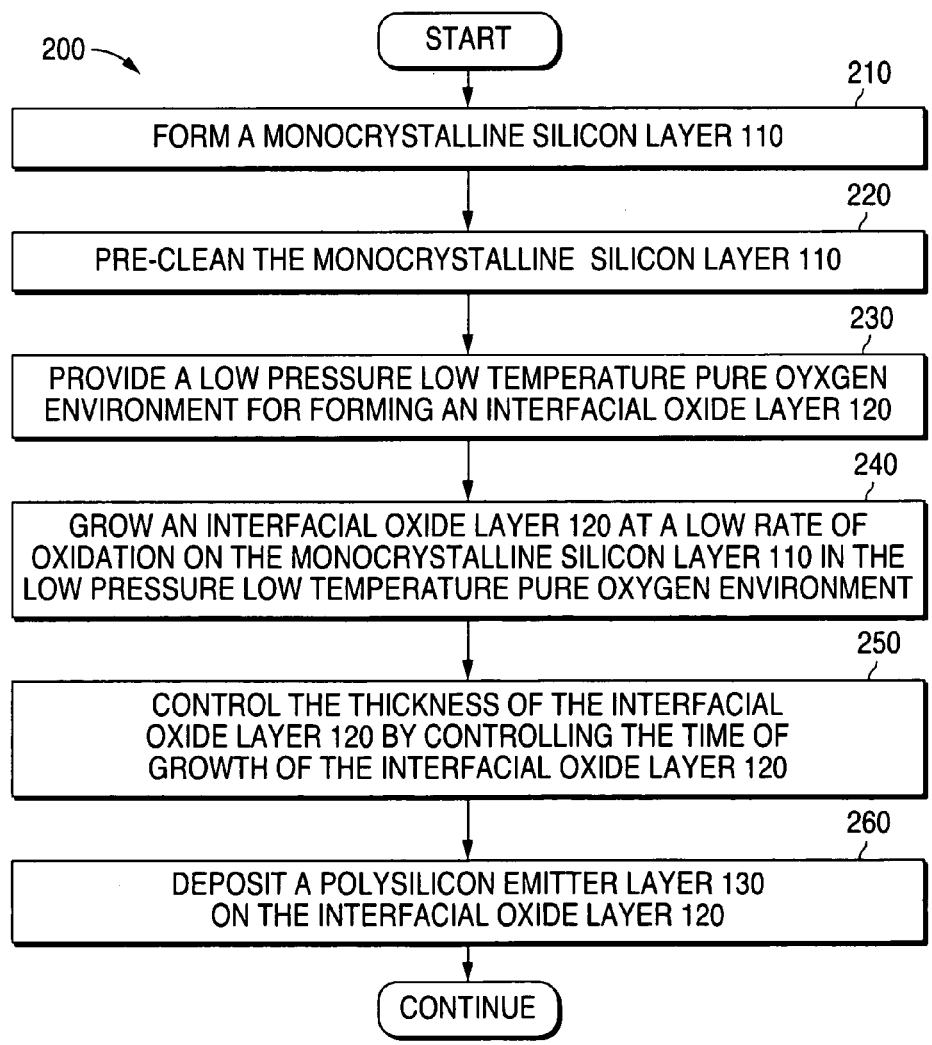
FIG. 2 illustrates a flow chart illustrating a first advantageous embodiment of the method of the present invention.

FIG. 2 illustrates a flow chart 200 illustrating a first advantageous embodiment of the method of the present invention. In the first step a monocrystalline silicon layer 110 is formed (step 210). Then a pre-clean step is applied to clean the monocrystalline silicon layer 110 (step 220). In this embodiment of the invention the pre-clean process that is utilized is one that does not grow any oxide on the surface of the monocrystalline silicon layer (e.g., "HF last" pre-clean process).

Then a low pressure, low temperature pure oxygen environment is provided to form an interfacial oxide layer 120 (step 230). The monocrystalline silicon layer 110 is placed in the environment and an interfacial oxide layer 120 is grown on the monocrystalline layer 110 at a low rate of oxidation (step 240). The thickness of the interfacial layer 120 is controlled by controlling the time of the growth of the interfacial layer 120 (step 250). After the interfacial layer 120 has been formed, a polysilicon emitter layer 130 is deposited on the interfacial oxide layer 120 (step 260).

Figure 3:
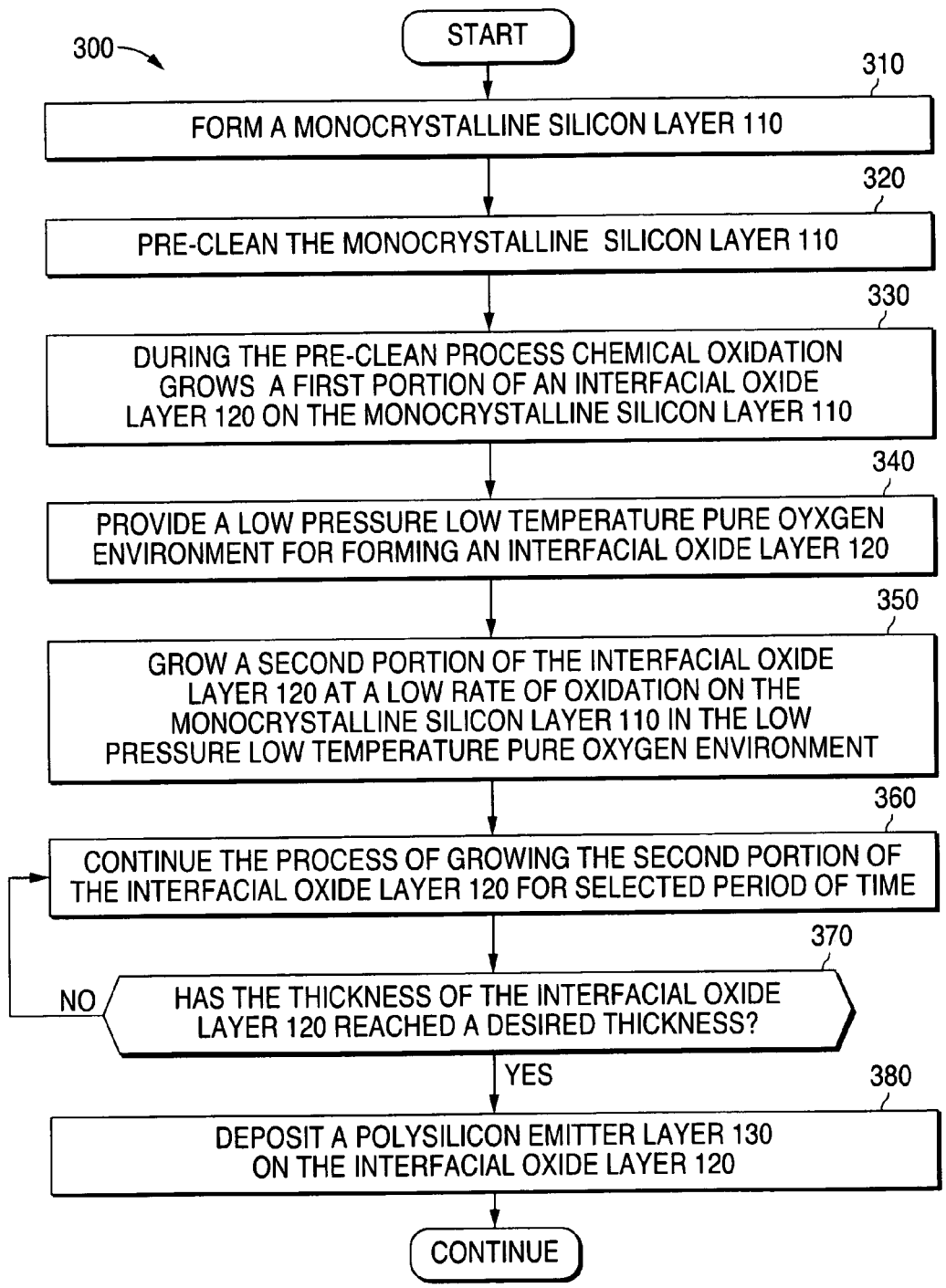
FIG. 3 illustrates a flow chart illustrating a second advantageous embodiment of the method of the present invention.

FIG. 3 illustrates a flow chart 300 illustrating a second advantageous embodiment of the method of the present invention. In the first step a monocrystalline silicon layer 110 is formed (step 310). Then a pre-clean step is applied to clean the monocrystalline silicon layer 110 (step 320). In this embodiment of the invention the pre-clean process that is utilized is one that grows oxide on the surface of the monocrystalline silicon layer (e.g., "RCA1 last" pre-clean process).

During the pre-clean process chemical oxidation grows a first portion of an interfacial oxide layer 120 on the monocrystalline silicon layer 110 (step 330). Then a low pressure, low temperature pure oxygen environment is provided to form an interfacial oxide layer 120 (step 340). The monocrystalline silicon layer 110 (having a first portion of an oxide layer formed by chemical oxidation) is placed in the environment and a second portion of the interfacial oxide layer 120 is grown on the monocrystalline layer 110 at a low rate of oxidation (step 350).

The process of growing the second portion of the interfacial oxide layer 120 is continued for a selected period of time (e.g., five (5) minutes). A determination is then made whether the thickness of the interfacial layer 120 has reached a desired thickness (decision step 370). If the thickness of the interfacial layer 120 has not reached the desired thickness, then the control passes back to step 360 (the "NO" branch) and the process of growing the second portion of the interfacial oxide layer 120 is continued for another selected period of time.

When the thickness of the interfacial layer 120 has reached the desired thickness, then the control passes to step 380 (the "YES" branch) and a polysilicon emitter layer 130 is deposited on the interfacial oxide layer 120 (step 380).

To illustrate the effect of the interfacial oxide layer that is formed by the method of the present invention four NPN bipolar junction transistors were formed and tested. As described more fully below, the interfacial oxide layer of each of the four NPN bipolar junction transistors was formed with a different surface treatment. The four NPN bipolar junction transistors were designated with the letters A, B, C and D.

The interfacial oxide layer in NPN transistor A was formed with an HF last pre-clean process, no chemical oxide, and thirty (30) minutes of low temperature low pressure oxidation. The interfacial oxide layer in NPN transistor B was formed with an RCA1 last pre-clean process, chemical oxide, and fifteen (15) minutes of low temperature low pressure oxidation. The interfacial oxide layer in NPN transistor C was formed with an RCAL last pre-clean process, chemical oxide, and thirty (30) minutes of low temperature low pressure oxidation.

For comparison, the interfacial oxide layer in NPN transistor D was formed with an RCA1 last pre-clean process, chemical oxide, and zero (0) minutes of low temperature low pressure oxidation. The results of the tests showing the various values of current gain β are shown in TABLE ONE below. The letter N represents the number of NPN transistors that were tested.

TABLE ONE

| NPN Transistor | A | B | C | D |
|---|---|---|---|---|
| Average β | 152.6 | 154.5 | 206.2 | 127.7 |
| 75% β | 159.4 | 163.2 | 214.7 | 127.2 |
| 25% β | 146.2 | 146.9 | 189.8 | 116.8 |
| Max β | 190.3 | 176.1 | 255.3 | 136.1 |
| Min β | 130.9 | 123.3 | 186.1 | 104.8 |
| N | 78 | 64 | 18 | 9 |
| Max Limit β | 205 | 205 | 205 | 205 |
| Min Limit β | 85 | 85 | 85 | 85 |

Figure 4:
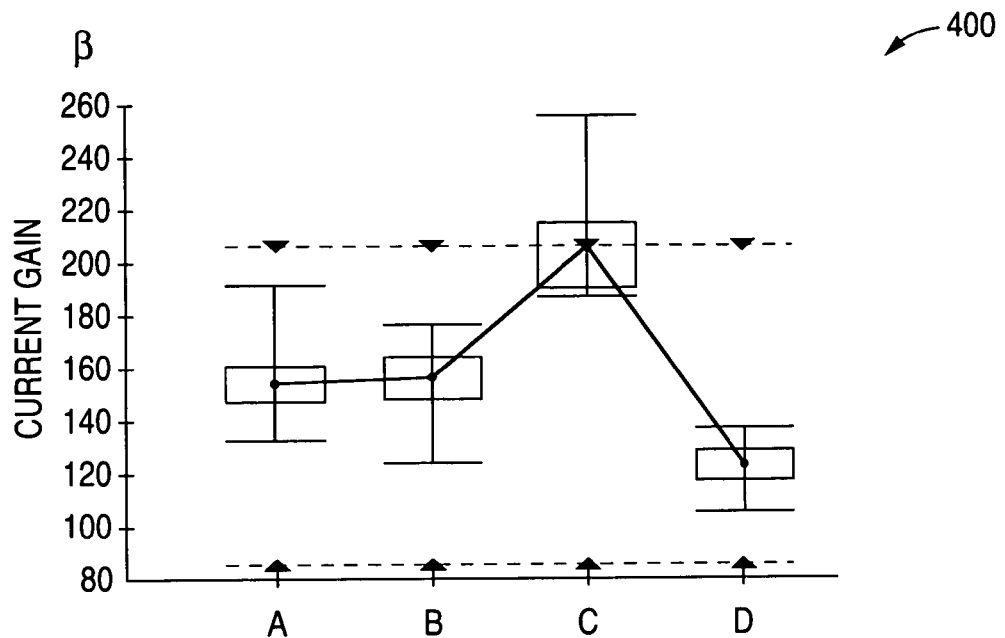
FIG. 4 illustrates a graph of values of current gain in NPN bipolar junction transistors that have an interfacial oxide layer formed using the method of the present invention.

FIG. 4 illustrates a graph 400 of values of current gain shown in TABLE ONE for test results of the four NPN bipolar junction transistors A, B, C and D.

To further illustrate the effect of the interfacial oxide layer that is formed by the method of the present invention four PNP bipolar junction transistors were also formed and tested. As described more fully below, the interfacial oxide layer of each of the four PNP bipolar junction transistors was formed with a different surface treatment. The four PNP bipolar junction transistors were designated with the letters E, F, G and H.

The interfacial oxide layer in PNP transistor E was formed with an HF last pre-clean process, no chemical oxide, and thirty (30) minutes of low temperature low pressure oxidation. The interfacial oxide layer in PNP transistor F was formed with an RCA1 last pre-clean process, chemical oxide, and fifteen (15) minutes of low temperature low pressure oxidation. The interfacial oxide layer in PNP transistor G was formed with an RCA1 last pre-clean process, chemical oxide, and thirty (30) minutes of low temperature low pressure oxidation.

For comparison, the interfacial oxide layer in PNP transistor H was formed with an RCA1 last pre-clean process, chemical oxide, and zero (0) minutes of low temperature low pressure oxidation. The results of the tests showing the various values of current gain β are shown in TABLE TWO below. The letter N represents the number of PNP transistors that were tested.

TABLE TWO

| NPN Transistor | E | F | G | H |
|---|---|---|---|---|
| Average β | 74.9 | 69.84 | 76.98 | 52.53 |
| 75% β | 76.69 | 71.93 | 79.31 | 53.68 |
| 25% β | 73.37 | 67.62 | 74.64 | 51.53 |
| Max β | 87.84 | 77.97 | 82.13 | 54.35 |
| Min β | 65.51 | 63.69 | 72.68 | 49.87 |
| N | 78 | 64 | 18 | 9 |
| Max Limit β | 95 | 95 | 95 | 95 |
| Min Limit β | 50 | 50 | 50 | 50 |

Figure 5:
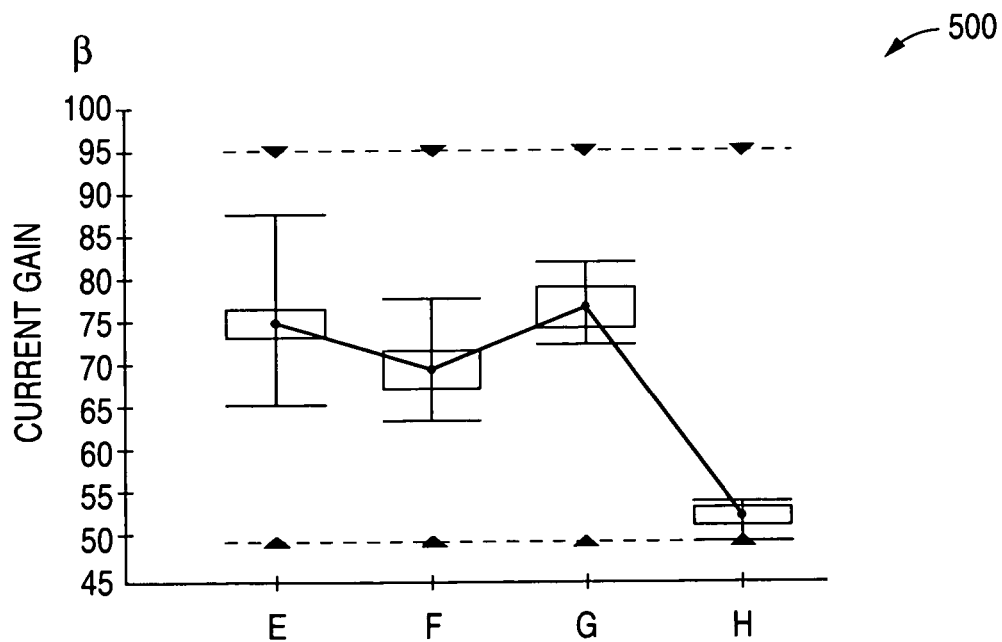
FIG. 5 illustrates a graph of values of current gain in PNP bipolar junction transistors that have an interfacial oxide layer formed using the method of the present invention.

FIG. 5 illustrates a graph 500 of values of current gain shown in TABLE TWO for test results of the four PNP bipolar junction transistors E, F, G. and H.

As described above, the system and method of the present invention for controlling the formation of an interfacial oxide in a polysilicon emitter transistor device comprises the step of growing the interfacial oxide in low pressure, low temperature pure oxygen ($O_2$) environment. The low pressure, low temperature pure oxygen ($O_2$) environment greatly reduces the oxidation rate so that the application of the thermal oxidation process can be better controlled. A major factor in decreasing the oxidation rate is the low pressure of the pure oxygen ($O_2$) environment.

The thickness of the interfacial oxide layer that is formed by the method of the present invention is controlled by adjusting the length of time that the thermal oxidation process is applied. Applying the thermal oxidation process for a relatively short time (e.g., five (5) to ten (10) minutes) results in an interfacial oxide layer that has a relatively small thickness. The relatively small thickness of the interfacial oxide layer corresponds to a relatively small value of the current gain β. A typical value of a relatively small thickness of the interfacial oxide layer is approximately six Ångstroms (6 Å).

Applying the thermal oxidation process for a longer period of time (e.g., up to thirty (30) minutes) results in an interfacial oxide layer that has a relatively large thickness. The relatively large thickness of the interfacial oxide layer corresponds to a relatively large value for the current gain β. A typical value of a relatively large thickness of the interfacial oxide layer is approximately twelve Ångstroms (12 Å) to fifteen Ångstroms (15 Å).

In one advantageous embodiment of the method of the invention, the thickness of the interfacial oxide layer (and the corresponding value of the current gain β) may be selected by controlling the time of application of the thermal oxidation process. Those persons skilled in the art will recognize that the thickness of the interfacial oxide layer can also be controlled by applying changes to the temperature or pressure during the formation of the interfacial oxide layer, or by applying a combination of the methods (i.e., controlling the time of application of the thermal oxidation process, and applying changes to the temperature, and applying changes to the pressure).

The low pressure, low temperature environment described above uses a pure oxygen ($O_2$) environment. It is understood, however, that it is also possible to use the low pressure, low temperature environment of the present invention in an environment that is not a pure oxygen ($O_2$) environment.

The method of the present invention has been described with reference to polysilicon emitters. It is understood, however, that those persons who are skilled in the art recognize that the method of the present invention could also be performed with amorphous silicon emitters.

Furthermore, it is also understood that those persons who are skilled in the art recognize that the emitters (whether polysilicon or amorphous silicon) could be deposited in an undoped state and then subsequently doped in a separate operation. The emitters could also be deposited in-situ doped or with a combination of undoped and in-situ doped layers.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for controlling a formation of an interfacial oxide layer in a polysilicon emitter transistor device, said method comprising the steps of:
    forming an interfacial oxide layer by applying a thermal oxidation process that has a low rate of thermal oxidation; and
    creating a desired thickness of said interfacial oxide layer by applying said thermal oxidation process for a selected period of time.

2. The method as set forth in claim 1 wherein said step of forming an interfacial oxide layer by applying a thermal oxidation process that has a low rate of thermal oxidation comprises the step of:
    applying said thermal oxidation process to form said interfacial oxide layer in a low temperature environment.

3. The method as set forth in claim 2 wherein said low temperature of said low temperature environment is in a range of approximately four hundred fifty degrees Celsius to approximately seven hundred degrees Celsius.

4. The method as set forth in claim 2 wherein said low temperature environment comprises a pure oxygen ($O_2$) environment.

5. The method as set forth in claim 1 wherein said step of forming an interfacial oxide layer by applying a thermal oxidation process that has a low rate of thermal oxidation comprises the step of:
    applying said thermal oxidation process to form said interfacial oxide layer in a low pressure environment.

6. The method as set forth in claim 5 wherein said low pressure of said low pressure environment is in a range of approximately fifty milliTorr (50 mTorr) to one thousand milliTorr (1000 mTorr).

7. The method as set forth in claim 5 wherein said low pressure environment comprises a pure oxygen ($O_2$) environment.

8. The method as set forth in claim 1 wherein said step of forming an interfacial oxide layer by applying a thermal oxidation process that has a low rate of thermal oxidation comprises the step of:
    applying said thermal oxidation process to form said interfacial oxide layer in a low temperature environment and a low pressure environment.

9. The method as set forth in claim 8 further comprising the steps of:
    forming said interfacial oxide layer on an underlying monocrystalline silicon layer; and
    applying a pre-clean process to said monocrystalline silicon layer before forming said interfacial oxide layer on said underlying monocrystalline silicon layer.

10. The method as set forth in claim 9 wherein pre-clean process applies a first portion of said interfacial oxide layer to said underlying monocrystalline layer by chemical oxidation.

11. A method for forming an interfacial oxide layer in a polysilicon emitter transistor device, said method comprising the steps of:
    forming a monocrystalline silicon layer;
    growing an interfacial oxide layer on said monocrystalline silicon layer by applying a thermal oxidation process that has a low rate of thermal oxidation in a low pressure environment and a low temperature environment;
    creating a desired thickness of said interfacial oxide layer by applying said thermal oxidation process for a selected period of time; and
    forming a polysilicon emitter layer on said interfacial oxide layer.

12. The method as set forth in claim 11 wherein said low temperature of said low temperature environment and said low pressure environment is in a range of approximately four hundred fifty degrees Celsius to approximately seven hundred degrees Celsius.

13. The method as set forth in claim 11 wherein said low pressure of said low temperature environment and said low pressure environment is in a range of approximately fifty milliTorr (50 mTorr) to one thousand milliTorr (1000 mTorr).

14. The method as set forth in claim 11 wherein said low temperature environment and said low pressure environment comprises a pure oxygen ($O_2$) environment.

15. The method as set forth in claim 11 further comprising the step of:
    applying a pre-clean process to said monocrystalline silicon layer before growing said interfacial oxide layer on said underlying monocrystalline silicon layer.

16. A method for forming an interfacial oxide layer in a polysilicon emitter transistor device, said method comprising the steps of:
    forming a monocrystalline silicon layer;
    applying a pre-clean process to said monocrystalline silicon layer that applies a first portion of said interfacial oxide layer to said monocrystalline silicon layer by chemical oxidation;
    growing a second portion of said interfacial oxide layer on said monocrystalline silicon layer by applying a thermal oxidation process that has a low rate of thermal oxidation in a low pressure environment and a low temperature environment;

applying said thermal oxidation process until said interfacial oxide layer has reached a desired thickness; and forming a polysilicon emitter layer on said interfacial oxide layer.

17. The method as set forth in claim 16 wherein said low temperature of said low temperature environment and said low pressure environment is in a range of approximately four hundred fifty degrees Celsius to approximately seven hundred degrees Celsius.

18. The method as set forth in claim 11 wherein said low pressure of said low temperature environment and said low pressure environment is in a range of approximately fifty milliTorr (50 mTorr) to one thousand milliTorr (1000 mTorr).

19. The method as set forth in claim 16 wherein said low temperature environment and said low pressure environment comprises a pure oxygen ($O_2$) environment.

20. The method as set forth in claim 16 wherein said step of applying said thermal oxidation process until said interfacial oxide layer has reached a desired thickness comprises:

periodically determining whether a thickness of said interfacial oxide layer has reached said desired thickness; and continuing to apply said thermal oxidation process for a selected period of time until said thickness of said interfacial oxide layer has reached said desired thickness.

* * * * *